(12) United States Patent
Hwan et al.

(10) Patent No.: US 6,602,762 B2
(45) Date of Patent: Aug. 5, 2003

(54) SYSTEM AND METHOD OF LASER SINTERING DIES AND DIES SINTERED BY LASER SINTERING

(75) Inventors: Lu-Chen Hwan, Hsinchu (TW); Dang-Cheng Yiu, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 10/103,971

(22) Filed: Mar. 25, 2002

(65) Prior Publication Data

US 2003/0008529 A1 Jan. 9, 2003

(30) Foreign Application Priority Data

Jul. 5, 2001 (TW) .................. 90116454 A

(51) Int. Cl.$^7$ .................. H01L 21/301; H01L 21/44; H01L 21/00
(52) U.S. Cl. .................. 438/460; 438/461; 438/463; 438/68; 438/964; 438/974; 438/106; 438/113; 438/114
(58) Field of Search .................. 438/460, 463, 438/380, 15, 26, 33, 64, 68, 106, 113, 114, 461, 964, 974

(56) References Cited

U.S. PATENT DOCUMENTS

| | | | | |
|---|---|---|---|---|
| 4,681,656 A | * | 7/1987 | Byrum | |
| 5,151,389 A | * | 9/1992 | Zappella | |
| 5,867,236 A | * | 2/1999 | Babuka et al. | |
| 5,895,226 A | * | 4/1999 | Baba et al. | |
| 6,023,094 A | * | 2/2000 | Kao et al. | |
| 6,420,245 B1 | * | 7/2002 | Manor | |
| 6,514,798 B2 | * | 2/2003 | Farnworth | |
| 2002/0127824 A1 | * | 9/2002 | Shelton et al. | |

* cited by examiner

Primary Examiner—John F. Niebling
Assistant Examiner—Stanetta Isaac
(74) Attorney, Agent, or Firm—Nixon Peabody LLP; Donald R. Studebaker

(57) ABSTRACT

A laser sintering system is provided for sintering a die having a serrate edge. The laser sintering system comprises a laser generator for generating a laser beam and a movable carriage for carrying said die. The laser beam sinters the serrate edge of said die into a smooth edge. A method of sintering a die, the die having a serrate edge, comprises the following steps of providing a die and using a laser beam sintering the serrate edge of said die into a smooth edge. A die has a smooth edge sintered by a laser beam.

5 Claims, 4 Drawing Sheets

SYSTEM AND METHOD OF LASER SINTERING DIES AND DIES SINTERED BY LASER SINTERING

BACKGROUND OF THE INVENTION

1. Field of the Invention

The present invention relates to a sintering system, a method of sintering a die and a die. More particularly, the invention relates to a laser sintering system, a method of using a laser beam sintering a die and a die sintered by a laser beam.

2. Description of the Prior Art

Generally, the semiconductor fabrication process could be sketchily divided into wafer fabrication process, wafer probe process, wafer packaging process and wafer test process. After finishing the fabrication process and the probe process, the wafer will undergo the wafer packaging process.

Before beginning the wafer packaging process, the wafer has to be sawed into dies by saw equipment. The purpose of the process is to separate the dies of the wafer. Using a die saw to saw the wafer during the process would obtain the individual dies.

The die saw is elaborate equipment. Since the distance between dies is quite small, usually about 2 mil, and the die is quite brittle, the die needs to be separated from each other by a diamond saw blade applying grinding procedure.

Due to the diamond saw blade during the wafer dicing process, the edge of each sawed die becomes serrate. As shown in FIGS. 1 to 3, the dies of prior art have serrate edges. The die 1 and die 2 have no coating layers on their first surface and second surface. Die 3 and die 4 have coating layers on their first surface and second surface. Since the integrated circuit fabricated by wafers is made of silicon single crystal, the serrate cracks of the dies 1,2,3,4 of prior art expand easily. These serrate cracks will cause the damage of the integrated circuit and decrease the yield of the product.

Therefore, there is a demand to provide a die having a smooth edge avoiding the damage of the integrated circuit and increasing the yield of the product. Furthermore, it is more demanding to provide an apparatus and a method of smoothing the surface of the die.

SUMMARY OF THE INVENTION

In view of the disadvantage of the die having a serrate edge of the prior art, the present invention provides a die having a smooth edge avoiding the cracks of the die and increasing the yield of the back-end process. In order to provide a die having a smooth edge, the present invention further provides a laser sintering system and a laser sintering method of smoothing the edge of the die.

An object of the present invention is to provide a system smoothing the edge of a die. For this purpose, the present invention provides a laser sintering system of smoothing a serrate edge of a die. The laser sintering system comprises a laser generator for generating a laser beam and a movable carriage for carrying the die. The laser beam sinters the serrate edges of the dies into smooth edges.

In accordance with an embodiment of the laser sintering system of the present invention, the first surface and the second surface of the die respectively have a coating layer.

In accordance with an embodiment of the laser sintering system of the present invention, the laser beam is a $CO_2$ laser beam, a Nd-YAG laser or an Excimer laser beam.

In accordance with an embodiment of the laser sintering system of the present invention, the laser sintering system further comprises a laser control unit for transmitting the first signal to the laser generator; a server engine for moving said carriage and a computer controller. The computer controller transmits the second signal to the laser control unit and the third signal to the servo engine.

Another object of the present invention is to provide a method of sintering a die having a serrate edge. The method comprises the following steps: providing a die and using a laser beam sintering the serrate edge of the die into smooth edges.

In accordance with an embodiment of the method of sintering the die, the first surface and the second surface of the die respectively have a coating layer.

In accordance with an embodiment of the method of sintering the die, the laser beam is a $CO_2$ laser beam, a Nd-YAG laser beam or an Excimer laser.

Still another purpose of the present invention is to provide a die having a smooth edge sintered by the laser beam.

In accordance with an embodiment of the die, the first surface and the second surface of the die respectively have a coating layer.

In accordance with an embodiment of the die, the laser beam is a $CO_2$ laser beam, a Nd-YAG laser beam or an Excimer laser.

DETAILED DESCRIPTION OF THE INVENTION

Figure 4:
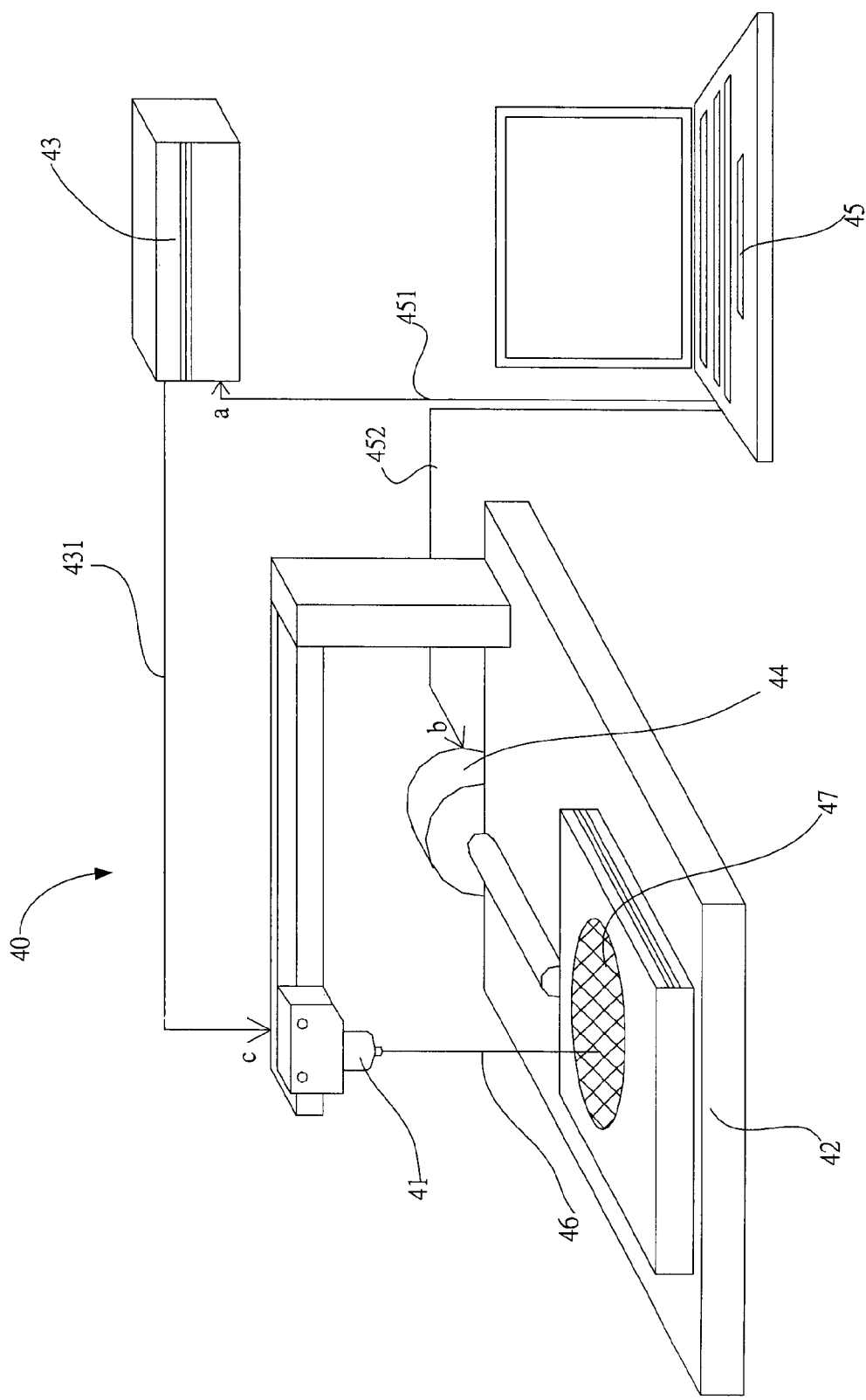
FIG. 4 shows the laser sintering system of the present invention.

The present invention provides a laser sintering system as shown in FIG. 4. The laser sintering system includes a laser generator 41, a carriage 42, a laser control unit 43, a servo engine 44 and a computer controller 45.

As shown in FIG. 4, the computer controller 45 controls the laser control unit 43 by transmitting a control signal "a" to the laser control unit 43 through a signal line 451. The computer controller 45 also controls the servo engine 44 by transmitting a control signal "b" to the server engine 44 through a signal line 452. After receiving the control signal "a" from the computer controller 45, the laser control unit 43 controls the generation of the laser beam by transmitting a control signal "c" to the laser generator 41 through a signal line 431. The servo engine 44 receives the control signal "b" form the computer controller 45 and controls the movement of the carriage 42.

Figure 1:
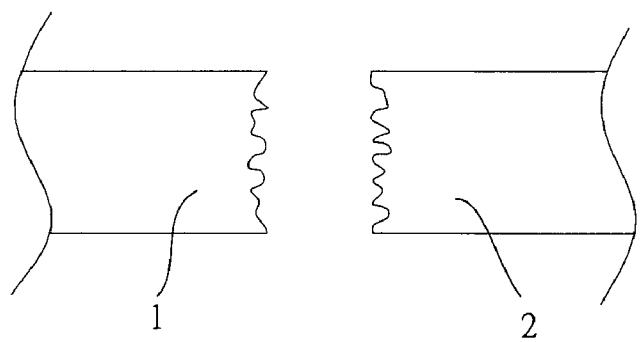
FIG. 1 shows the cross-section of the die of prior art.
Figure 2:
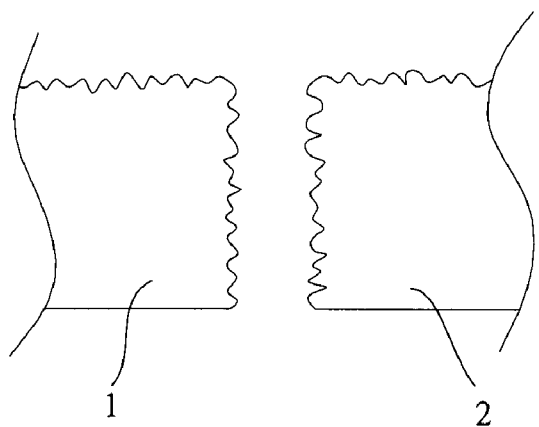
FIG. 2 shows the top-view of the die of prior art.
Figure 3:
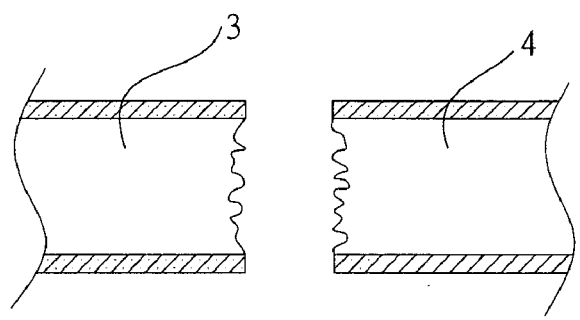
FIG. 3 shows the cross-section of the die having coating layers on its first surface and second surface of prior art.

There is a plurality of dies 47 having serrate edges shown in FIGS. 1 to 3 being put on the carriage 42. The servo engine 44 receiving the signal "b" from the computer controller 45 controls the movement of the carriage 42. And the laser generator 41 receiving the control signal "c" form the laser control unit 43 generates a laser beam 46. Thus, the laser beam 46 sinters the serrate edges of the plurality of the dies 47 into smooth edges, shown in FIGS. 5 to 7.

Figure 5:
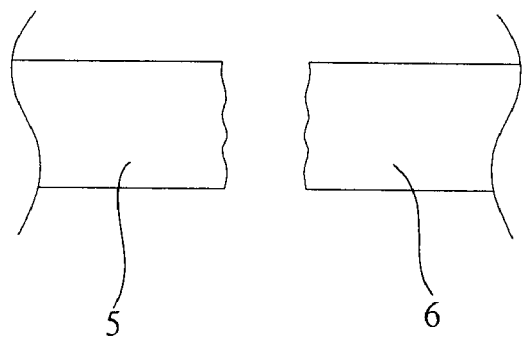
FIG. 5 shows the cross-section of the die processed by the laser sintering system and method of the present invention.
Figure 6:
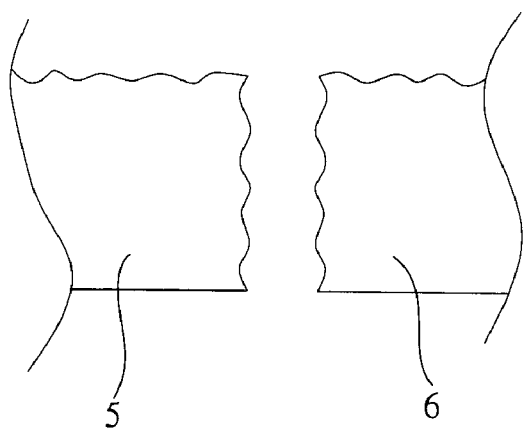
FIG. 6 shows the top-view of the die processed by the laser sintering system and method of the present invention.

The laser sintering system 40 of the present invention sinters the dies 5, 6 without a coating layer on their first and second surface as shown in FIGS. 5, 6. Further, the laser sintering system 40 of the present invention sinters the dies 7, 8 with a coating layer on their first and second surface as shown in FIGS. 7, 8.

Furthermore, the laser beam of the laser sintering system of the present invention could be a $CO_2$ laser beam, a Nd-YAG laser beam or an Excimer laser beam.

Figure 7:
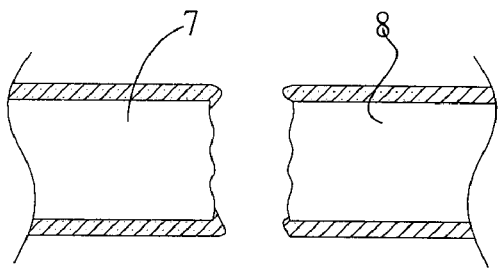
FIG. 7 shows the cross-section of the die having coating layers on its first surface and second surface processed by the laser sintering system and method of the present invention.
Figure 8:
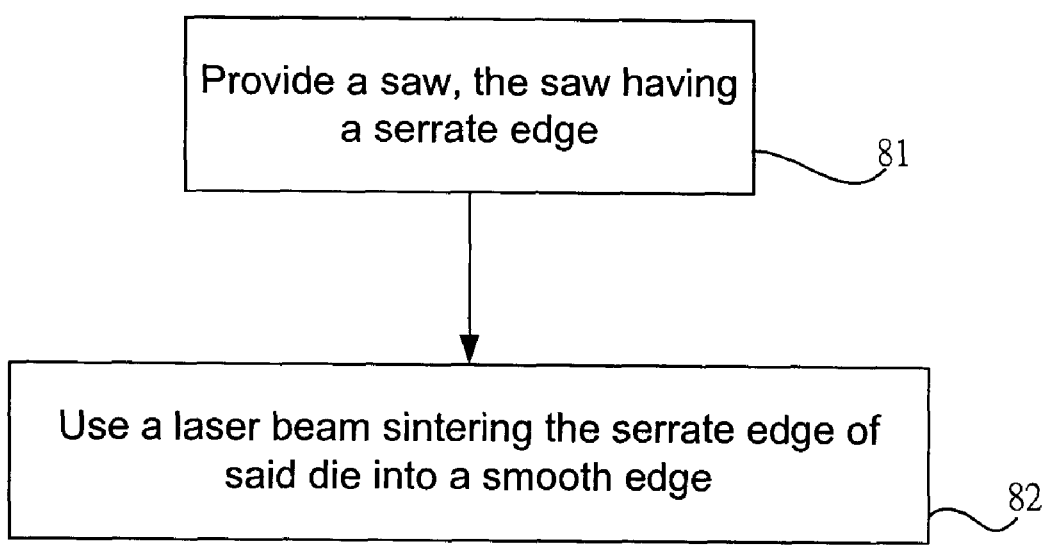
FIG. 8 shows the flowchart of the method of laser sintering of the present invention.

As shown in FIGS. 5 to 7, the present invention provides a die 5, 6, 7, 8, each having a smooth edge after the sinter process by a laser beam.

As shown in FIG. 7, in accordance with an embodiment of the present invention, the die 7, 8 have coating layers on their first and second surface. Furthermore, in accordance with an embodiment of the present invention, the laser beam is a $CO_2$ laser beam, a Nd-YAG laser beam or an Excimer laser beam.

After sintering the serrate edges of the dies 1, 2, 3, 4 by the laser energy and high temperature, the present invention obtain dies 5, 6, 7, 8 having smooth edges. The sinter process won't crack the dies and increases the yield of the back-end process.

With reference to FIG. 8, the present invention provides a method of sintering a die having a serrate edge. The present invention first provides a die having serrate edges in the step 81. In the step 82, the present invention uses a laser beam to sinter the serrate edge into a smooth edge.

In accordance with an embodiment of the present invention, the first surface and second surface of the die respectively have a coating layer.

In accordance with an embodiment of the present invention, the laser beam is a $CO_2$ laser beam, a Nd-YAG laser beam or an Excimer laser beam.

While this invention has been described with reference to an illustrative embodiment, this embodiment is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method for sintering a die, said die having a serrate edge, comprising the following steps:

(1) providing a die; and (2) using a laser beam sintering the serrate edge of said die into a smooth edge.

2. The method of claim 1, wherein said die having a first surface and a second surface respectively having a coating layer.

3. The method of claim 1, wherein said laser beam is a $CO_2$ laser beam.

4. The method of claim 1, wherein said laser beam is a Nd-YAG laser beam.

5. The method of claim 1, wherein said laser beam is an Excimer laser beam.

* * * * *